US009656569B2

(12) United States Patent
Takikita et al.

(10) Patent No.: US 9,656,569 B2
(45) Date of Patent: May 23, 2017

(54) VEHICLE POWER SOURCE APPARATUS

(71) Applicants: Mamoru Takikita, Chiyoda-ku (JP); Youhei Matsuda, Chiyoda-ku (JP)

(72) Inventors: Mamoru Takikita, Chiyoda-ku (JP); Youhei Matsuda, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 523 days.

(21) Appl. No.: 14/350,392

(22) PCT Filed: Feb. 21, 2013

(86) PCT No.: PCT/JP2013/053221
§ 371 (c)(1),
(2) Date: Apr. 8, 2014

(87) PCT Pub. No.: WO2013/157289
PCT Pub. Date: Oct. 24, 2013

(65) Prior Publication Data
US 2015/0021986 A1 Jan. 22, 2015

(30) Foreign Application Priority Data

Apr. 19, 2012 (JP) ................... 2012-095219

(51) Int. Cl.
*B60L 3/00* (2006.01)
*B60L 11/18* (2006.01)
(Continued)

(52) U.S. Cl.
CPC ......... *B60L 11/1851* (2013.01); *B60L 3/0046* (2013.01); *B60L 3/0069* (2013.01);
(Continued)

(58) Field of Classification Search
CPC ........ B60L 3/0046; B60L 3/0069; B60L 3/04; B60L 11/1851; B60L 11/1868;
(Continued)

(56) References Cited

U.S. PATENT DOCUMENTS 5,561,380 A    10/1996  Sway-Tin et al.
6,255,008 B1    7/2001  Iwase
(Continued)

FOREIGN PATENT DOCUMENTS

CN    101214796 A    7/2008
CN    201821261 U    5/2011
(Continued)

OTHER PUBLICATIONS

Communication dated Sep. 30, 2015 from the State Intellectual Property Office of the People's Republic of China in counterpart Application No. 201380007600.4.
(Continued)

*Primary Examiner* — Levi Gannon
(74) *Attorney, Agent, or Firm* — Sughrue Mion, PLLC; Richard C. Turner

(57) ABSTRACT

A vehicle power source apparatus is provided with a driving battery mounted in a vehicle, an auxiliary apparatus battery that supplies electric power to an auxiliary apparatus of the vehicle, a DC power conversion unit that supplies electric power from the driving battery to the auxiliary apparatus battery, a control unit that controls the DC power conversion unit, a driving battery harness that connects the driving battery with the DC power conversion unit and is protected by a shield, an auxiliary apparatus battery negative-side harness that connects the DC power conversion unit with the negative side of the auxiliary apparatus battery, and a voltage sensor that detects a connection abnormality in the auxiliary apparatus battery negative-side harness.

7 Claims, 1 Drawing Sheet

(51) Int. Cl.
*G01R 31/02* (2006.01)
*H02J 7/00* (2006.01)
*B60L 3/04* (2006.01)
*H02H 7/18* (2006.01)

(52) U.S. Cl.
CPC ............. *B60L 3/04* (2013.01); *B60L 11/1816* (2013.01); *B60L 11/1868* (2013.01); *G01R 31/025* (2013.01); *H02H 7/18* (2013.01); *H02J 7/0021* (2013.01); *H02J 7/0036* (2013.01); *B60L 2210/10* (2013.01); *B60L 2240/36* (2013.01); *B60L 2240/547* (2013.01); *Y02T 10/7005* (2013.01); *Y02T 10/7066* (2013.01); *Y02T 10/7216* (2013.01)

(58) Field of Classification Search
CPC ...... B60R 16/033; G01R 31/025; H02H 7/18; H02J 7/0013; H02J 7/0021; H02J 7/0026; H02J 7/0031; H02J 7/0036; H02J 7/0085; H02J 7/0086; H02J 7/1423; Y02T 10/7005
USPC .......................... 307/9.1, 10.1, 10.7; 324/509
See application file for complete search history.

(56) References Cited

U.S. PATENT DOCUMENTS

| | | | | |
|---|---|---|---|---|
| 7,098,624 B2* | 8/2006 | Kusaka | ................. | B60L 3/0023 318/727 |
| 7,690,453 B2* | 4/2010 | Kinoshita | ........... | B60L 11/1868 180/65.1 |
| 8,299,800 B2* | 10/2012 | Tsujiko | .................. | G01R 31/36 320/165 |
| 2010/0052419 A1 | 3/2010 | Oosawa et al. | | |
| 2011/0254559 A1* | 10/2011 | Nakashima | ........... | B60L 3/0046 324/427 |
| 2012/0299597 A1* | 11/2012 | Shigemizu | .......... | H01M 10/441 324/428 |
| 2012/0330486 A1* | 12/2012 | Jingu | .................... | B60L 11/123 701/22 |
| 2013/0202918 A1* | 8/2013 | Kimura | ................. | H02J 7/0016 429/7 |

FOREIGN PATENT DOCUMENTS

| | | |
|---|---|---|
| JP | 6-52342 U | 7/1994 |
| JP | 7-63806 A | 3/1995 |
| JP | 8-320352 A | 12/1996 |
| JP | 2005-151712 A | 6/2005 |
| JP | 2010-141984 A | 6/2010 |
| JP | 2010-207054 A | 9/2010 |
| JP | 2010-246285 A | 10/2010 |

OTHER PUBLICATIONS

Japanese Office Action for 2012-095219 dated Jan. 7, 2014.
International Search Report for PCT/JP2013/053221 dated Mar. 19, 2013.
Communication dated Oct. 26, 2015 from the European Patent Office issued in corresponding European application No. 13778064.9.

* cited by examiner

VEHICLE POWER SOURCE APPARATUS

CROSS REFERENCE TO RELATED APPLICATIONS

This application is a National Stage of International Application No. PCT/JP2013/053221 filed Feb. 12, 2013, claiming priority based on Japanese Patent Application No. 2012-095219 filed Apr. 19, 2012, the contents of all of which are incorporated herein by reference in their entirety.

TECHNICAL FIELD

The present invention relates to a vehicle power source apparatus to be mounted in a vehicle, such as an electric automobile or a hybrid automobile, that has a driving battery and an auxiliary apparatus battery.

BACKGROUND ART

In recent years, as environment-friendly automobiles, electric automobiles and hybrid automobiles have been developed. Each of the foregoing automobiles has a driving battery in addition to an auxiliary apparatus battery for, as is the case with a conventional automobile, supplying electric power to auxiliary apparatuses. Accordingly, it is required to charge the driving battery and as is the case with a conventional automobile, it is required to charge the auxiliary apparatus battery. In the case where the auxiliary apparatus battery is charged, the electric power of the driving battery is converted into DC electric power by a DC power converter and then the auxiliary apparatus battery is charged with the DC electric power.

Electric power is supplied from the driving battery to the DC power converter by way of a harness; similarly, the auxiliary apparatus battery is charged by way of a harness. In this situation, the electric power supplied from the driving battery needs to cover the electric power that is consumed by the auxiliary apparatuses. Because its voltage is high, the current of the driving battery is approximately 10 A; because insulation is provided in order to prevent an electric shock, shielded wires are utilized. As far as the electric power with which the auxiliary apparatus battery is charged is concerned, the voltage thereof is low, but the current thereof is 100 A or larger; therefore, a thick harness is utilized for the positive side of the output of the DC power converter. Because the electric potential of the negative side of the output is the same as that of the vehicle chassis, the case of the DC power converter, as the negative side, is directly connected with the vehicle chassis through a thick harness, a screw, or the like, as is the case with the positive side.

Meanwhile, in Japanese Patent Application Laid-Open No. H8-320352 (Patent Document 1), an apparatus that detects electric leakage from a driving battery utilized in a DC power converter is disclosed. In the electric leakage detection apparatus disclosed in Patent Document 1 is provided with a high-voltage DC power source that is mounted in a vehicle and is electrically separated from the chassis of the vehicle, two high-resistance protection resistors connected between the positive and negative sides of the high-voltage DC power source, an electric leakage detection resistor whose one terminal is connected with the connection point between the two protection resistors, a switch that opens or closes the connection between the other terminal of the electric leakage detection resistor and the chassis, a voltage measurement unit that measures the voltage across the electric leakage detection resistor, and an electric leakage determination unit that determines electric leakage, based on the output of the voltage measurement unit; the switch opens or closed the connection between the electric leakage detection resistor and the chassis, so that the electric leakage detection apparatus itself intermittently causes a dielectric breakdown.

PRIOR ART REFERENCE

Patent Document

[Patent Document 1] Japanese Patent Application Laid-Open No. H8-320352

DISCLOSURE OF THE INVENTION

Problem(s) to be Solved by the Invention

In the electric leakage detection apparatus disclosed in Patent Document 1, it is made possible to detect electric leakage caused by an abnormality in the harness between the driving battery and the DC power converter; however, it is not made possible to detect an abnormality in the harness between the DC power converter and the auxiliary apparatus battery. As a result, for example, when the negative current path between the auxiliary apparatus battery and the DC power converter is disconnected or loosely connected, the shield of the driving battery works as the current path; thus, there has been a problem that the shield gains heat or catches fire, the insulative coat melts, and hence electric leakage of the driving battery is caused.

The present invention has been implemented in order to solve the foregoing problems; the objective thereof is to provide a vehicle power source apparatus that detects the fact that a negative current path between the auxiliary apparatus battery and the electric power converter is disconnected or loosely connected and then prevents a fire or electric leakage from occurring.

Means for Solving the Problems

A vehicle power source apparatus according to the present invention includes a driving battery mounted in a vehicle, an auxiliary apparatus battery that supplies electric power to an auxiliary apparatus of the vehicle, a DC power conversion unit that supplies electric power from the driving battery to the auxiliary apparatus battery, a control unit that controls the DC power conversion unit, a first connection means that connects the driving battery with the DC power conversion unit and is protected by a shield, a second connection means that connects the DC power conversion, unit with the negative side of the auxiliary apparatus battery, and a detection means that detects a connection abnormality in the second connection means.

Advantage of the Invention

A vehicle power source apparatus according to the present invention includes a driving battery mounted in a vehicle, an auxiliary apparatus battery that supplies electric power to an auxiliary apparatus of the vehicle, a DC power conversion unit that supplies electric, power from the driving battery to the auxiliary apparatus battery, a control unit that controls the DC power conversion unit, a first connection means that connects the driving battery with the DC power conversion unit, and is protected by a shield, a second connection means that connects the DC power conversion unit with the negative side of the auxiliary apparatus battery, and a detection means that detects a connection abnormality in the second connection means; the vehicle power source apparatus detects a connection abnormality in the second connection means and then stops the charging of the auxiliary apparatus battery or reduces electric power; thus, a risk such as a fire in the first connection means or electric leakage can be prevented.

BEST MODE FOR CARRYING OUT THE INVENTION

Embodiment 1

Figure 1:
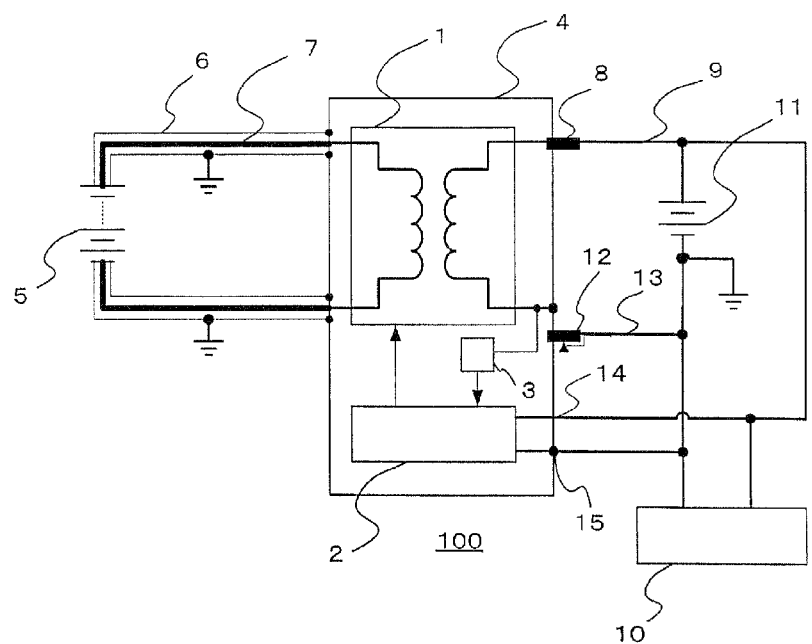
FIG. 1 is a block diagram representing the overall configuration of a vehicle power source apparatus according to Embodiment 1 of the present invention.

FIG. 1 is a block diagram representing the overall configuration of a vehicle power source apparatus according to Embodiment 1 of the present invention.

In FIG. 1, a vehicle power source apparatus 100 is provided with a DC power conversion unit 1, a control unit 2 that controls the DC power conversion unit 1, a voltage sensor 3, and a case 4 that contains the DC power conversion unit 1, the control unit 2, and the voltage sensor 3. A driving battery harness 7, which is a first connection means and is protected by a shield 6, connects the DC power conversion unit 1 with the driving battery 5 that supplies a high voltage. The positive-side output of the DC power conversion unit 1 is connected with the positive electrode of the auxiliary apparatus battery 11 that supplies electric power to an auxiliary apparatus 10, by way of an auxiliary apparatus positive terminal 8 and an auxiliary apparatus battery positive-side harness 9, which is second connection means. The negative output of the DC power conversion unit 1 is connected with the case 4. Furthermore, the case 4 is connected with the negative electrode of the auxiliary apparatus battery 11, by way of an auxiliary apparatus negative terminal 12 and an auxiliary apparatus battery negative-side harness 13. The control unit 2 is connected with the auxiliary apparatus battery 11 by means of a control unit power source terminal 14 and a control unit grounding terminal 15. The voltage sensor 3 is provided in the case 4, measures the voltage of the case 4, and inputs the measurement result to the control unit 2. The shield 6 is grounded.

The vehicle power source apparatus according to Embodiment 1 is configured as described above; next, the operation thereof will be explained.

In the normal operation mode, the output current of the DC power conversion unit 1 passes through the auxiliary apparatus positive terminal 8 and the auxiliary apparatus battery positive-side harness 9 so that the auxiliary apparatus battery 11 is charged with the output current; then, the output current returns to the DC power conversion unit 1 by way of the auxiliary apparatus battery negative-side harness 13, the auxiliary apparatus negative terminal 12, and the case 4. In this situation, because the auxiliary apparatus battery positive-side harness 9 and the auxiliary apparatus battery negative-side harness 13 are for a large current application and hence the resistance values thereof are low, the output value of the voltage sensor 3 is approximately zero. However, when a connection abnormality occurs, i.e., in the case where the auxiliary apparatus negative terminal 12 is disconnected from the auxiliary apparatus battery negative-side harness 13 or in the case where the connection between them is imperfect and hence the contact resistance increases, the output current of the auxiliary apparatus positive terminal 8 returns to the case 4 by way of the shield 6.

Because the shield 6 is applied to insulation and it is not anticipated that a large current flows in the shield 6, the resistance value thereof is large and hence gains more heat as the output value of the voltage sensor 3 becomes larger. Accordingly, when the output value of the voltage sensor 3 exceeds a given threshold value, the control unit 2 controls the DC power conversion unit 1 so as to stop the output thereof. Alternatively, the control unit 2 suppresses the output current of the DC power conversion unit 1 so as to prevent the output value of the voltage sensor 3 from exceeding the given threshold value. As a result, it is made possible to prevent the shield 6 from gaining heat and catching fire or to prevent electric leakage caused by such phenomena.

As described above, in the vehicle power source apparatus according to Embodiment 1, the voltage sensor 3 detects such a connection abnormality as the negative current path between the auxiliary apparatus battery 11 and the DC power converter 1 is disconnected or loosely connected, and then the charging of the auxiliary apparatus battery 11 is stopped or the electric power therefor is reduced; thus, a fire in or electric leakage from the driving battery harness 7 can be prevented from occurring.

Embodiment 2

Next, a vehicle power source apparatus according to Embodiment 2 of the present invention will be explained. In Embodiment 1, the voltage sensor detects the phenomenon that the negative current path between the auxiliary apparatus battery and the DC power converter is disconnected or loosely connected; however, the same effect can be demonstrated even when instead of the voltage sensor a current sensor is utilized.

Figure 2:
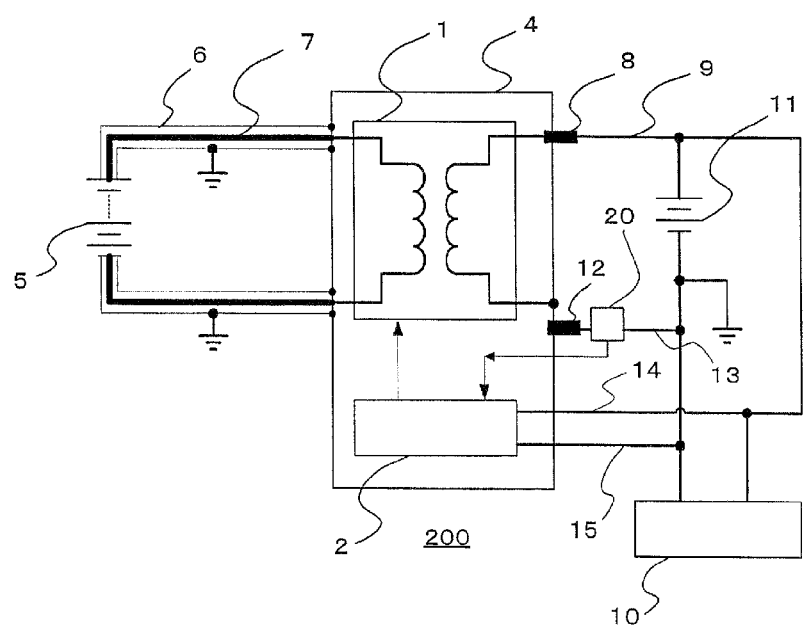
FIG. 2 is a block diagram representing the overall configuration of a vehicle power source apparatus according to Embodiment 2 of the present invention.

FIG. 2 is a block diagram representing the overall configuration of a vehicle power source apparatus according to Embodiment 2 of the present invention. In FIG. 2, in a vehicle power source apparatus 200, a current sensor 20 measures a current flowing in the case 4 and the auxiliary apparatus battery negative-side harness 13 and inputs the measurement result to the control unit 2. Other configurations are the same as those in Embodiment 1; thus, the same reference numerals are explanations therefor will be omitted.

The vehicle power source apparatus according to Embodiment 2 is configured as described above; next, the operation thereof will be explained.

In the normal operation mode, the output current of the DC power conversion unit 1 passes through the auxiliary apparatus positive terminal 8 and the auxiliary apparatus battery positive-side harness 9, which is a second connection means, so that the auxiliary apparatus battery 11 is charged with the output current; then, the output current returns to the DC power conversion unit 1 by way of the auxiliary apparatus battery negative-side harness 13, which is a third connection means, the auxiliary apparatus negative terminal 12, and the case 4. In this situation, because the auxiliary apparatus battery positive-side harness 9 and the auxiliary apparatus battery negative-side harness 13 are for a large current application and hence the resistance values thereof are low, the power losses therein are small and the output value of the current sensor 20 is equal to the output current of the DC power conversion unit 1. However, when a connection abnormality occurs, i.e., in the case where the auxiliary apparatus negative terminal 12 is disconnected from the auxiliary apparatus battery negative-side harness 13 or in the case where the connection between them is imperfect and hence the contact resistance increases, the output current of the auxiliary apparatus positive terminal 8 returns to the case 4 by way of the shield 6.

As a result, the output value of the current sensor 20 becomes smaller than the output current of the DC power conversion unit 1. When the difference between the output value of the voltage sensor 20 and the output current of the DC power conversion unit 1 exceeds a given threshold value, the control unit 2 controls the DC power conversion unit 1 so as to stop the output thereof. Alternatively, the output current of the DC power conversion unit 1 is suppressed from exceeding the threshold value; thus, it is made possible to prevent the shield 6 from gaining heat and catching fire or to prevent electric leakage caused by such phenomena.

In the foregoing description, there has been explained a case where the current sensor 20 measures the current in the auxiliary apparatus battery negative-side harness 13; however, the same effect can be demonstrated even when the current in or the temperature of the shield 6 is measured.

In each of Embodiments 1 and 2, there has been explained a case where the driving battery 5 supplies electric power to the DC power conversion unit 1 by way of the driving battery harness 7 and the auxiliary apparatus battery 11 is charged by way of the auxiliary apparatus battery positive-side harness 9; however, the same effect can be demonstrated through a method in which the auxiliary apparatus battery 11 supplies electric power to the DC power conversion unit 1 by way of the auxiliary apparatus battery positive-side harness 9 and the driving battery 5 is charged by way of the driving battery harness 7.

As explained heretofore, a vehicle power source apparatus according to the present invention detects the phenomenon that the negative-side current path between the auxiliary apparatus battery and the DC power conversion unit is disconnected or loosely connected and then stops the charging of the auxiliary apparatus battery or reduces the electric power therefor, so that a risk such as heating or electric leakage can be prevented; thus, the vehicle power source apparatus according to the present invention can promote the widespread of an environment-friendly electric automobile or hybrid automobile.

The present invention is not limited the foregoing examples; in the scope of the present invention, the embodiments thereof can freely be combined with one another and can appropriately be modified or omitted.

The invention claimed is:

1. A vehicle power source apparatus comprising:
a driving battery mounted in a vehicle;
an auxiliary apparatus battery that supplies electric power to an auxiliary apparatus of the vehicle;
a DC power conversion unit that supplies electric power from the driving battery to the auxiliary apparatus battery;
a control unit that controls the DC power conversion unit;
a first connection means that connects the driving battery with the DC power conversion unit and is protected by a shield;
a second connection means that connects the DC power conversion unit with the negative side of the auxiliary apparatus battery;
a detection means that detects a connection abnormality in the second connection means; and
a case that contains the DC power conversion unit, the control unit, and the detection means,
wherein the shield surrounds only the first connection means, and
wherein the detection means detects a connection abnormality by determining whether or not an output current from a positive side of the auxiliary apparatus battery returns to the case through the shield.

2. The vehicle power source apparatus according to claim 1, wherein the detection means measures a voltage of the case so as to detect a connection abnormality.

3. The vehicle power source apparatus according to claim 1, wherein the detection means measures a current flowing in the second connection means so as to detect a connection abnormality.

4. The vehicle power source apparatus according to claim 1, wherein the detection means measures a current flowing in the shield of the first connection means so as to detect a connection abnormality.

5. The vehicle power source apparatus according to claim 1, wherein the detection means measures a temperature of the shield of the first connection means so as to detect a connection abnormality.

6. The vehicle power source apparatus according to claim 1, wherein when the detection means detects a connection abnormality, the control unit stops the output of the DC power conversion unit.

7. The vehicle power source apparatus according to claim 1, wherein the control unit controls the output of the DC power conversion unit so that the detection means does not detect a connection abnormality.

* * * * *